(12) United States Patent
Muto et al.

(10) Patent No.: US 6,236,110 B1
(45) Date of Patent: May 22, 2001

(54) POWER SEMICONDUCTOR MODULE

(75) Inventors: Hirotaka Muto; Toshiyuki Kikunaga; Takeshi Ohi; Shin-ichi Kinouchi; Takeshi Horiguchi; Osamu Usui; Tatsuya Okuda, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/537,401

(22) Filed: Mar. 29, 2000

(30) Foreign Application Priority Data

Apr. 5, 1999 (JP) ............... 11-097246
Mar. 6, 2000 (JP) ............... 12-059713

(51) Int. Cl.$^7$ ............................ H01L 23/34
(52) U.S. Cl. ..................... 257/724; 257/784
(58) Field of Search .................. 257/723, 724, 257/784, 341

(56) References Cited

U.S. PATENT DOCUMENTS

| | | | |
|---|---|---|---|
| 5,243,219 | * | 9/1993 | Ymada et al. . |
| 5,446,318 | * | 8/1995 | Koike et al. . |
| 5,463,251 | * | 10/1995 | Fujuta et al. . |
| 5,929,119 | * | 7/1999 | Tamba et al. . |
| 5,956,231 | * | 9/1999 | Yamada et al. . |
| 6,011,302 | * | 6/2000 | Nakahira . |

FOREIGN PATENT DOCUMENTS

| | | |
|---|---|---|
| 2301151 | 12/1990 | (JP) . |
| 8-213547 | * 8/1996 | (JP) . |
| 8204180 | 8/1996 | (JP) . |
| 9-121019 | * 5/1997 | (JP) . |

* cited by examiner

Primary Examiner—Sheila V. Clark
(74) Attorney, Agent, or Firm—Leydig, Voit & Mayer, Ltd

(57) ABSTRACT

A current detecting sensor includes parallel flat plates opposed in a substantially U-shape in cross-section. Since the flat plates are opposed to each other, the current detecting sensor has reduced inductance, significantly decreasing frequency dependency of outputs from detection terminals.

6 Claims, 11 Drawing Sheets

FIG. 3
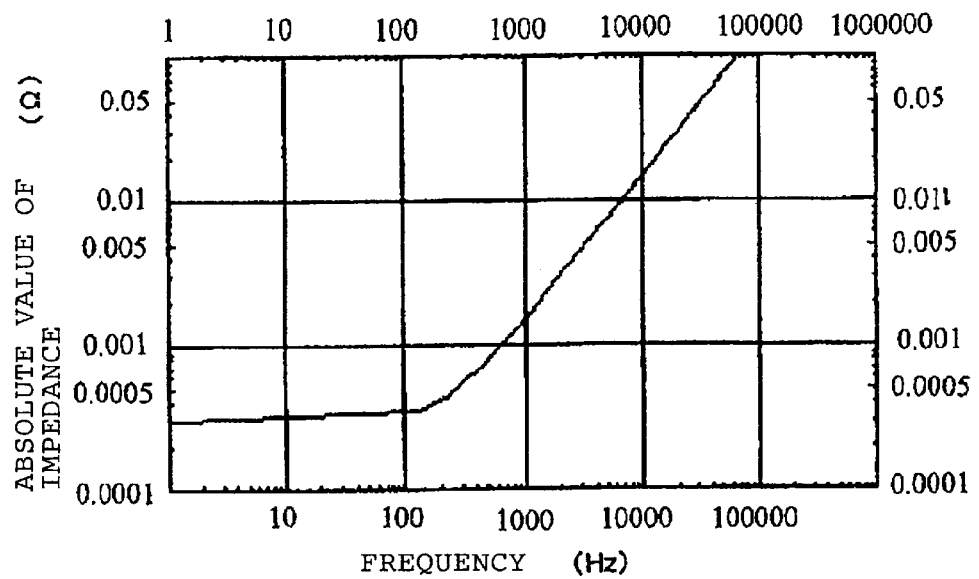
(a)
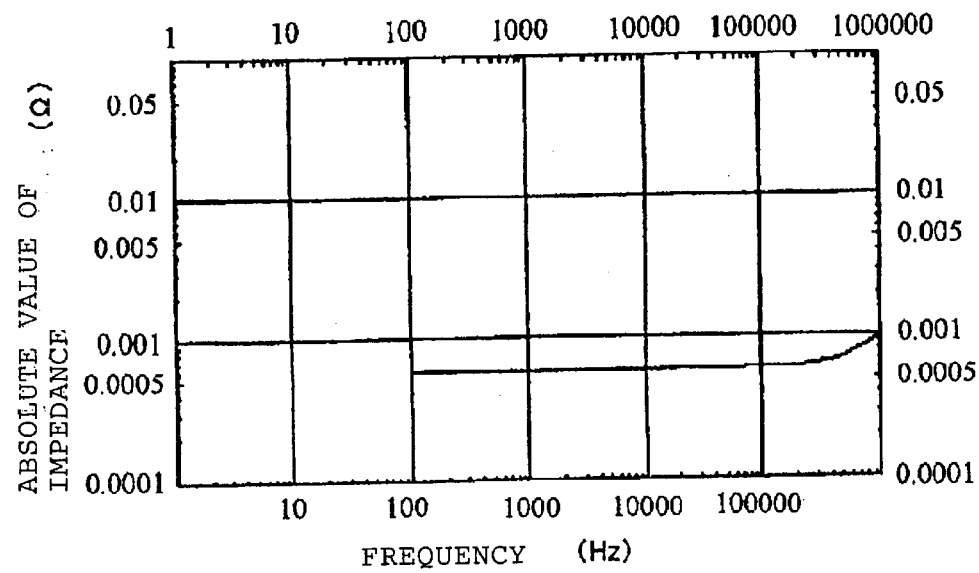
(b)

POWER SEMICONDUCTOR MODULE

BACKGROUND OF THE INVENTION

Field of the Invention

The present invention relates to a power semiconductor module which is used in power conversion equipment, such as an inverter and a converter.

The power semiconductor module involves a MOSFET module with a plurality of MOSFET (Metal Oxide Semiconductor Field Effect Transistor) devices built therein, a diode module with a plurality of diode devices built therein, an IGBT module with a plurality of IGBT (Insulated Gate Bipolar Transistor) devices and a plurality of diode devices built therein. Now, the internal structure of the power semiconductor module will be explained in the case of an IGBT module with a plurality of IGBT devices and a plurality of diode devices as semiconductor devices coupled in parallel.

In FIG. 10 is shown a plan view of a semiconductor device section and its vicinities of a conventional IGBT module (hereinbelow, referred to as the module). In FIG. 11 is shown a cross-sectional view of a pair of IGBT device and diode device, and their vicinities in the module. In the module, four IGBT devices and four diode devices are connected in parallel to provide a single module. An IGBT device and a diode device adjacent thereto are reversely connected in parallel so that the emitter of the IGBT device and the anode of the diode device are at the same potential, and the collector of the IGBT device and the cathode of the diode device are at the same potential.

In FIGS. 10 and 11, reference numeral 1 designates a heat dissipating plate made of copper to cool the semiconductor devices, reference numeral 2 designates an aluminum nitride substrate as an insulating substrate, reference numeral 21 designates an electrode pattern provided on each of opposite sides of the aluminum nitride substrate 2, reference numeral 3 designates an IGBT device, and reference numeral 4 designates a diode device. The IGBT device 3 and the diode device 4 are soldered on the electrode pattern 21 side by side. The aluminum nitride substrate 2 is bonded onto the heat dissipating plate 1 by soldering.

Each of the IGBT devices 3 has an emitter electrode 31 provided thereon by patterning, and each of the diode devices 4 has an anode electrode 41 provided thereon by patterning. The emitter electrode is connected to the anode electrode and further to an emitter trunk substrate 7 by aluminum wires 51. The electrode pattern 21 on an aluminum nitride substrate 2, on which an IGBT device 3 and a diode device 4 are soldered, is connected to one of collector trunk substrates 8 by aluminum wires 52. Reference numeral 25 designates a housing, which is made of resin material and is fixed to the heat dissipating plate 1. The collector trunk substrates 8 have electrode patterns provided thereon, and the respective electrode patterns are connected to a module collector electrode 9. To the emitter trunk substrate 7 is connected a module emitter electrode 10. The module emitter electrode 10 and the module collector electrode 9 are connected to a load or the like outside the module housing 25.

In order to control a gate potential for on and off operation of the IGBT devices 3, aluminum wires 53 extend from wiring boards 11 to gate terminals 32 of the IGBT devices 3. Reference numeral 19 designates a module gate electrode, which is connected to the gate terminals 32 of the respective IGBT devices 3 through the wiring boards 11 in the module. Reference numeral 33 designates a current sensing terminal, which is provided on one of the IGBT devices 3, and through which a small current flows in proportion to a current flowing through the emitter electrode 31 of the one IGBT device 3.

In the module with the IGBT devices provided as stated earlier, an overcurrent flows at a value beyond a rated current during operation in some cases, or an excessive current can flow in the module because of short circuit on a load side. When an excessive current flows at a value beyond a rated current in the module, the IGBT devices are heated to be broken, which requires module replacement. In order to prevent the module from being broken due to an overcurrent, it is required that a current flowing through the IGBT devices be detected and that the IGBT devices are turned off immediately before an excessive current flows. A protection circuit is provided in order to prevent the breakage of the IGBT devices, which might cause from the presence of such an overcurrent or on short circuit on a load side.

In FIG. 12 is shown a block diagram of such a protection circuit. Reference numeral 12 designates the module, and reference numeral 13 designates the one IGBT device 3 with the current sensing terminal 33. The current sensing terminal 33 is utilized to detect a primary current flowing through the module emitter electrode 10. The current sensing terminal 33 detects a current flowing through the single IGBT device 13 among the four IGBT devices 3 in the module 12, and the detected current is inputted into a protection circuit 16 against an overcurrent or a short circuit current. Under the action of the protection circuit, a gate voltage control circuit 17 outputs a gate voltage at such a value to turn off the IGBT devices 3 to protect the entire module 2 as required.

The respective IGBT devices 3 have a large number of fine IGBT cells (not shown) connected in parallel therein. The emitter electrode 31 and the current sensing terminal 33 are connected to a large number of IGBT cells in the corresponding IGBT device 13, respectively. The ratio of the number of the IGBT cells connected to the emitter electrode 31 and the number of the IGBT cells connected to the current sensing terminal 33 is set at around 1,000 to 1. Both groups of IGBT cells are separated, and the current that flows through the emitter electrode 31 is measured based on the current that flows through the current sensing terminal 33.

As another prior art, there is a method wherein a resistive element (not shown) is provided at a location in a primary current path and the value of the primary current is detected based on a voltage drop across the resistive element.

A current flowing through the current sensing terminal and the current flowing trough the emitter electrode do not necessarily have the relationship corresponding to the ratio of the numbers of the IGBT cells connected to the respective terminals. The reason is that the IGBT devices are heated during operation to cause a certain temperature distribution on a device surface, and that the temperature of the IGBT cells connected to the current sensing terminal is different from the temperature of the IGBT cells connected to the emitter electrode since the IGBT cells connected to the current sensing terminal is located at a certain position on the device surface. For this reason, the current value detected at the current sensing terminal has not reflected the actual current flowing through the module emitter electrode in accurate fashion in some cases.

In addition, there is provided a problem in that the current flowing through the current sensing terminal varies due to variations in the device production.

In the method to provide a resistive element in a primary current path, the variations in detected values can be minimized since the voltage drop across the resistive element is detected. However, a conventional flat plate shaped resistive element has created a problem in that high-frequency characteristics are not good since the resistive element has large inductance. In the case of a power semiconductor module, such as the IGBT module, a current as large as around 100 A is measured at every IGBT device for instance. In order to reduce power loss caused by the insertion of the resistive element, the resistive element is required to have resistance as low as mΩ. The flat plate shaped resistive element having such resistance has created a problem in that impedance due to inductance is more dominant than impedance due to resistance in high frequencies from 100 kHz to 1 MHz, and that detection characteristics depend on frequencies.

It is an object of the present invention to provide a power semiconductor module including a current sensing unit capable of detecting a primary current with good precision even in a high frequency region.

According to a first aspect of the present invention, there is provided a power semiconductor module comprising an insulating substrate, a plurality of semiconductor devices provided on the insulating substrate, a plurality of module electrodes provided on the insulating substrate and connected to the semiconductor device, a current sensing unit, the current sensing unit comprising a current sensor including a conductor provided in a primary current path, and the conductor including parallel flat plates so as to have a substantially U-character shape in section, wherein a primary current is detected from a potential difference between inner portions of the conductor.

According to a second aspect of the present invention, the current sensor may be integrally formed with a module electrode.

According to a third aspect of the present invention, the current sensor may be provided on an insulating substrate.

According to a fourth aspect of the present invention, the current sensor may have an insulating film provided between the parallel flat plates in close contact, and one of the parallel flat plates may be provided on the insulating substrate in close contact.

According to a fifth aspect of the present invention, the current sensor may have an insulating film provided between the parallel flat plates in close contact, and one of the parallel flat plates may be provided on a semiconductor device.

According to a sixth aspect of the present invention, the current sensing unit includes two current sensors, and the two current sensors have equal inductance, wherein the primary current is detected from a difference between potential differences at inner portions of the respective current sensors.

According to the first aspect of the present invention, the current sensor can have inductance greatly reduced to offer an advantage that a primary current can be detected with good precision even in a high frequency region since the power semiconductor module comprises the current sensor including the conductor provided in the primary current path, and the conductor including parallel flat plates so as to have a substantially U-character shape in section, wherein the primary current is detected from a potential difference between inner portions of the conductor.

According to the second aspect of the present invention, the power semiconductor module can have a simple structure since the current sensor is integrally formed with the module electrode.

According to the third aspect of the present invention, the power semiconductor module can have a great degree of freedom with respect to the arrangement of the current sensor so as to be versatilely applicable to modules having different structures since the current sensor is provided on the insulating substrate.

According to the fourth aspect of the present invention, the heat that has been generated in the current sensor can be dissipated through the insulating substrate to provide a good heat radiating effect since the current sensor has an insulating film provided between the parallel flat plates in close contact, and since one of the parallel flat plates is provided on the insulating substrate in close contact. When the insulating film is made thin, the current sensor can have inductance further reduced to offer an advantage that a primary current can be detected with good precision even in a higher frequency region.

According to the fifth aspect of the present invention, the current sensor has an insulating film provided between the parallel flat plates in close contact, and one of the parallel flat plates is provided on a semiconductor device. As a result, the insulating film can be made thin to reduce the inductance in the current sensor. The module can be made smaller since there is no additional space for the current sensor.

According to the sixth aspect of the present invention, the two current sensors, which have equal inductance, can be provided so as to be combined to reduce or eliminate the influence of inductance, allowing a primary current to be detected with good precision even in a higher frequency region.

The invention will now be described by way of example and with reference to the accompanying drawings in which:

FIG. 1 is a perspective view of the power semiconductor module according to a first embodiment of the present invention;

FIGS. 2(a) and 2(b) are perspective views to explain a current sensing unit of the power semiconductor module according to the first embodiment;

FIGS. 3(a) and 3(b) are a graph showing the frequency characteristics of a conventional current sensing unit and a graph showing the frequency characteristics of the current sensing unit of the power semiconductor module according to the first embodiment;

EMBODIMENT 1

Figure 1:
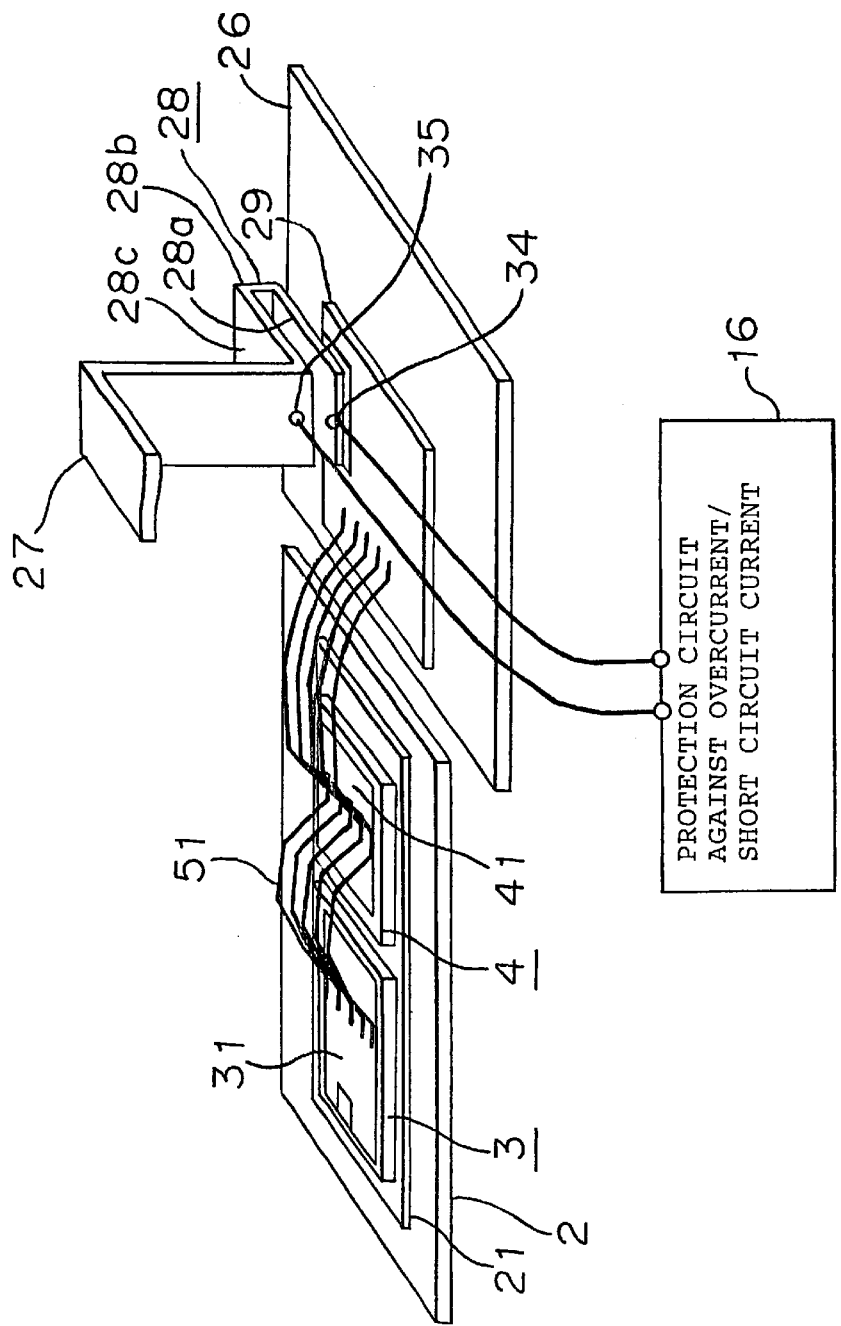

In FIG. 1 is shown a perspective view of the power semiconductor module according to a first embodiment of the present invention. Although the module shown in FIG. 1 is mounted to a heat dissipating plate 1 and covered with a housing 25 in practice as in that shown in FIGS. 8 and 9, these members are omitted in FIG. 1 wherein an IGBT device and a current sensing unit in the module are shown along with their vicinities.

In FIG. 1, reference numeral 2 designates an aluminum nitride substrate as an insulating substrate, reference numeral 21 designates an electrode pattern provided on the aluminum nitride substrate 2, reference numerals 3 and 4 the IGBT device and a diode device as semiconductor devices soldered on the electrode pattern 21, respectively, reference numeral 26 designates an emitter trunk substrate as an insulating substrate, reference numeral 29 designates an electrode pattern provided on the emitter trunk substrate 26, and reference numeral 27 designates a module emitter electrode as a module electrode, which is connected to an external device for flow of a primary current, and which is shown with a part thereof omitted. Reference numeral 28 designates the current sensing unit, which comprises a conductor (made of copper in this example) including parallel flat plate so as to have a substantially U-character shape in section. The current sensing unit comprises first and second flat plates 28a, 28c as the parallel flat plates, and a bent portion 28b connected between one end of the first flat plate 28a and one end of the second flat plate 28c. The other end of the first flat plate 28a is connected to the electrode pattern 29 by soldering to provide a detection terminal 34. The other end of the second flat plate 28c is integral with the module emitter electrode 27 to provide another detection terminal 35.

The electrode pattern 29 on the emitter trunk substrate 26 is connected to the anode electrode 41 of the diode device 4 and the emitter electrode 31 of the IGBT device 3 by aluminum wires 51.

Reference numeral 16 designates a protection circuit against an overcurrent/short circuit current.

Now, the operation of the power semiconductor module will be explained. The primary current, which flows through the power semiconductor module (hereinbelow, referred to as the module), passes through the emitter electrode 31 of the IGBT device 3, passes through the aluminum wires 51, passes through the current sensor 28 from the electrode pattern 29 on the emitter trunk substrate 26, and then flows into the module emitter electrode 27. A potential difference between internal portions of the current sensor, that is to say, a voltage drop in the primary current between both detection terminals 34, 35 is detected, and a signal indicative of the detected voltage drop is inputted into the protection circuit against an overcurrent/short circuit current. The detected voltage is determined by the resistance between the detection terminals 34, 35 since the inductance between both detection terminals 34, 35 is made small by forming the current path in the current sensor 28 by the use of the parallel flat plates opposed each other. Accordingly, an output is generated between both detection terminals 34, 35 so as to have flat frequency characteristics and magnitude in proportion to the primary current. Thus, the protection for the module can be correctly carried out at a certain current value. The operation of the current sensing unit will be explained in more specific fashion.

Figure 2A:
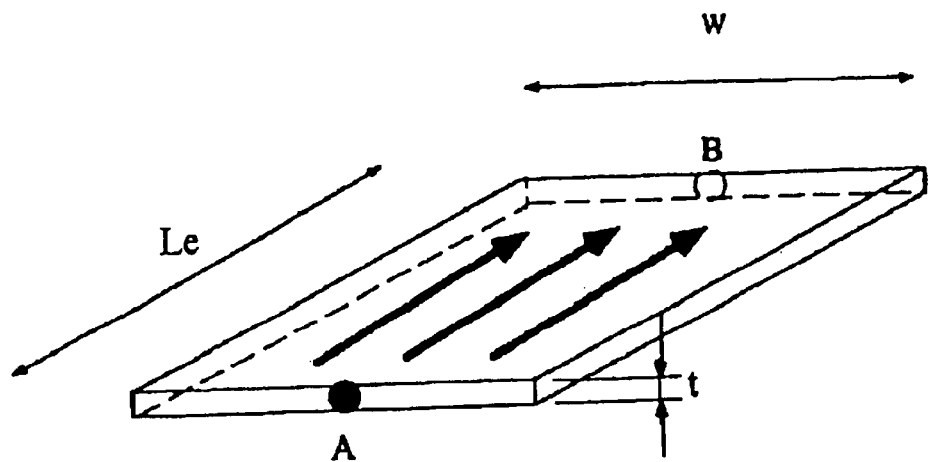
Figure 2B:
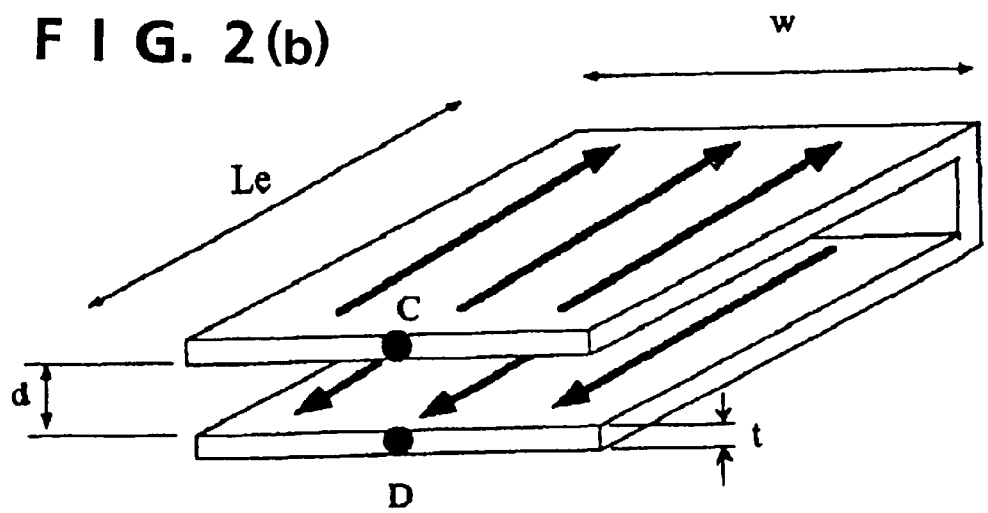

In FIGS. 2(a) and 2(b) are shown perspective views to explain the current sensing unit, which is used in a current detection method by the use of resistor insertion. In FIG. 2(a) is shown a flat plate shaped resistive element, which has used for current detection in the prior art. In FIG. 2(b) is shown the current sensing unit according to the present invention, wherein the parallel flat plates having a substantially U-character shape in section is used as a resistor. Symbols A, B, C and D designate terminals, and the flow of a current is indicated by thick arrows. The current sensing unit has impedance equivalent to series connection of a resistive component and an inductive component. The voltage V between the opposed terminals in each of the circuits, which is generated when a current flows, is expressed by the following equation:

$$V=(R+j\omega L)I$$

where symbol R is the resistance between the opposed terminal, j is an imaginary unit, symbol $\omega$ is an angular frequency, symbol L is the inductance between the opposed terminal, and symbol I is a current. Provided that the plate has a thickness of t, a width of w and a length of Le in FIG. 2(a), the resistance of this structure is expressed by the following equation:

$$R=RO \times Le/(t \times w)$$

where symbol RO is the resistivity of the plate. Provided that t is 0.1 mm, Le is 10 mm and w is 10 mm, and that the plate is made of copper, the resistivity RO is about $1.5 \times 10^{-6}$ $\Omega \cdot cm$. Accordingly, the resistance between the terminals A and B is $0.3 \times 10^{-3}$ $\Omega$.

The inductance $L_{AB}$ between the terminals A and B is approximately expressed by the following equation:

$$L_{AB}=u(\log(2Le/(w+t))+0.5))/2\pi$$

wherein u represents a space permeability.

Accordingly, the impedance $Z_{AB}$ between the terminals A and B is expressed by the following equation:

$$Z_{AB}=0.3 \times 10^{-3}+j2 \times 3.14 \times f \times 2.4 \times 10^{-7} \Omega$$

In this equation, f represents a frequency.

On the other hand, the inductance $L_{CD}$ of the flat plates, which have a substantially U-character shape in section as shown in FIG. 2(b), is approximately expressed by the following equation:

$$L_{CD}=u \times d \times Le/w$$

wherein d represents the gap between the opposed flat plates. In the calculation of $L_{CD}$, the thickness of the plates is neglected for simplification. Provided that d is 0.1 mm, the inductance $L_{CD}$ is $1.3 \times 10^{-10}$H. Accordingly, the impedance $Z_{CD}$ between the terminals C and D is expressed by the following equation:

$$Z_{CD}=0.6 \times 10^{-3}+j2 \times 3.14 \times f \times 1.3 \times 10^{-10} \Omega$$

For simplification, the skin effect given by a high frequency current has been neglected.

The absolute values of impedance with respect to frequencies in both cases are calculated, and the calculation results are shown in FIGS. 3(a) and 3(b) In the case of the flat plate shaped resistive element, which has been commonly used and is shown in FIG. 2(a), depends on frequencies from 300 Hz as shown in FIG. 3(a). On the other hand, the structure according to the present invention as shown in FIG. 2(b), the structure with the parallel flat plates formed in a substantially U-character shape in section, has flat characteristics without depending on frequencies up to a high frequency region of 600 kHz as shown in FIG. 3(b). As shown, the structure with the parallel flat plates formed in a substantially U-character shape in section can reduce the inductance in comparison with a resistive component to greatly improve the frequency dependency of the voltage between the detection terminals.

As explained, a current sensor with flat frequency characteristics and good detection precision can be provided by forming the primary current path from parallel flat plates so as to have a substantially U-character shape in section.

Since the current sensor according to the present invention detects a voltage drop across a conductor by a primary current, the current sensor is free from inconsistency between the emitter current of an IGBT device and a detected value in practice, which has been commonly found in the prior art with the current sensing terminals used therein.

EMBODIMENT 2

Figure 4:
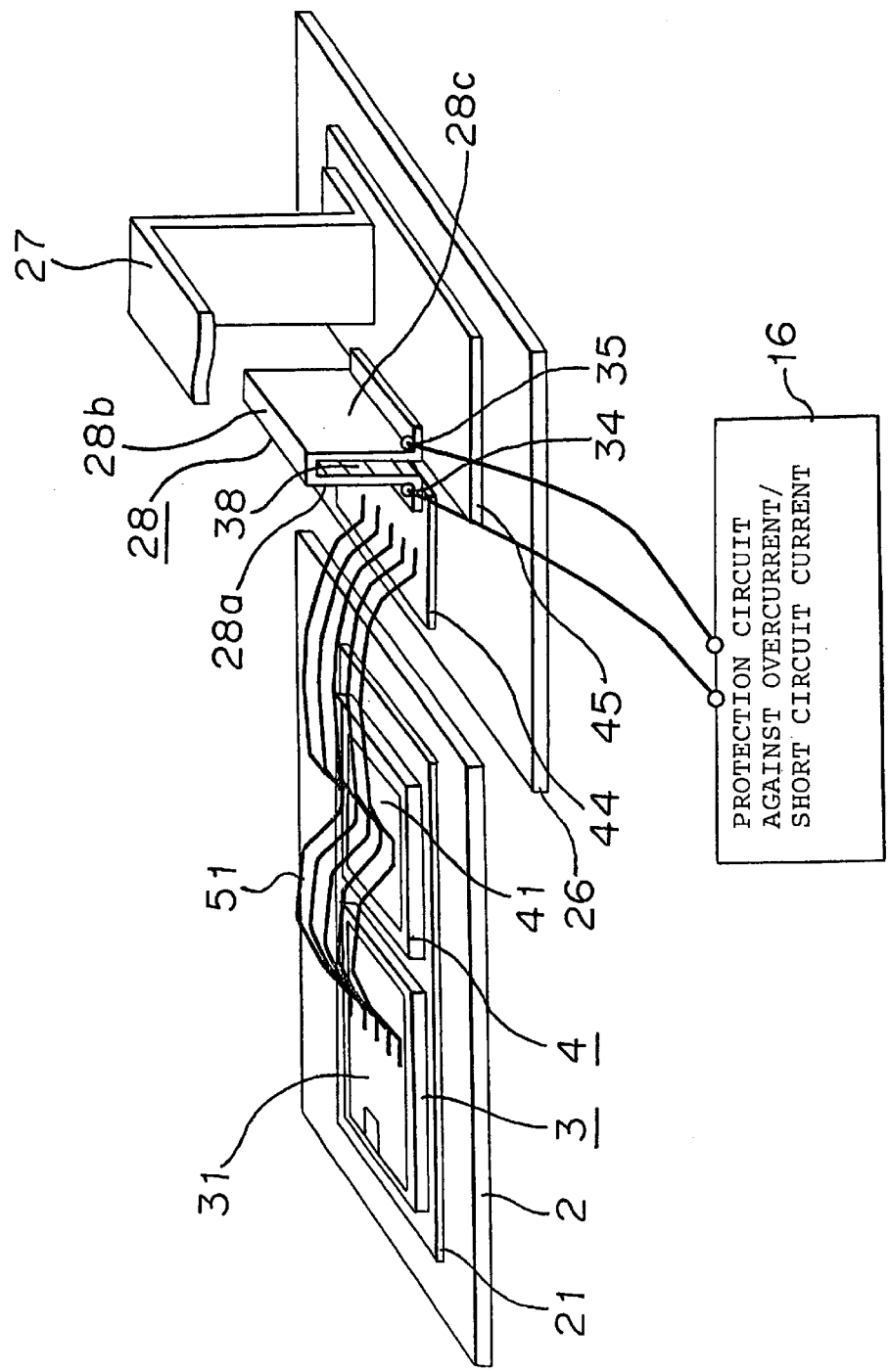
FIG. 4 is a perspective view of the power semiconductor module according a second embodiment of the present invention.

In FIG. 4 is shown a perspective view of the module according to a second embodiment of the present invention. In this Figure, reference numerals 44 and 45 designate first and second electrode patterns provided on the emitter trunk substrate 26, which are spaced with a small gap. Reference numeral 38 designates an insulator, which is provided between the first and second flat plates 28a, 28c of the current sensor 28. The first flat plate 28a has one end soldered to the first electrode pattern 44, and the second flat plate 28c has one end soldered to the second electrode pattern 45. The module emitter electrode 27 is soldered to the second electrode pattern 45. The first electrode pattern 44 is connected to the anode electrode 41 of the diode device 4 and the emitter electrode 31 of the IGBT device 3 through aluminum wire 51. Explanation of other elements will be omitted since these elements are similar to those of the first embodiment.

The primary current flowing through the IGBT device 3 passes the current sensor 28 from the first electrode pattern 44 on the emitter trunk substrate 26, flows through the second electrode pattern 45 and flows into the module emitter electrode 27. A voltage drop in the primary current between both detection terminals 34, 35 of the current sensor 28 is detected, and a signal indicative of the detected voltage drop is inputted into the protection circuit against an overcurrent/short circuit current 16.

In this embodiment as in the first embodiment, the detected voltage is determined by the resistance between the detection terminals 34, 35 since the inductance between both detection terminals 34, 35 is made small by forming the primary current path in the current sensor 28 by the use of the parallel flat plates opposed each other. Accordingly, an output is generated between both detection terminals so as to have flat frequency characteristics and magnitude in proportion to the primary current.

In accordance with this embodiment, the current sensor 28 is provided on the emitter trunk substrate 26 to be separate from the module emitter electrode 27 so as to increase a degree of freedom with respect to the arrangement of the current sensor 28, being versatilely applicable to modules having different structures.

EMBODIMENT 3

Figure 5:
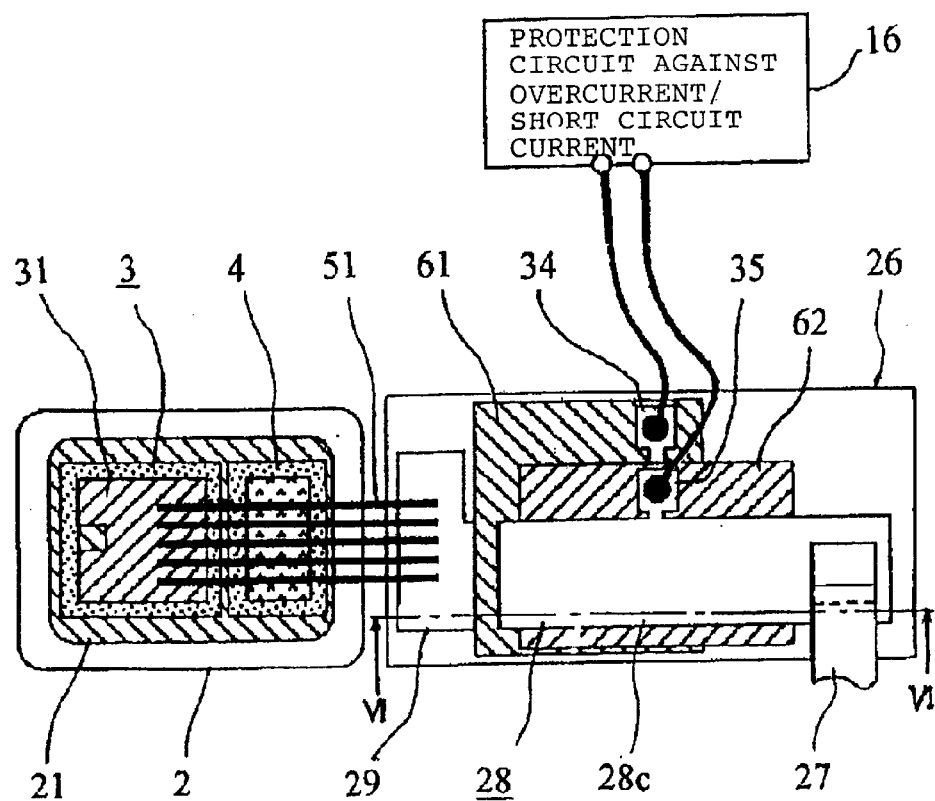
FIG. 5 is a plan view of the power semiconductor module according to a third embodiment of the present invention.
Figure 6:
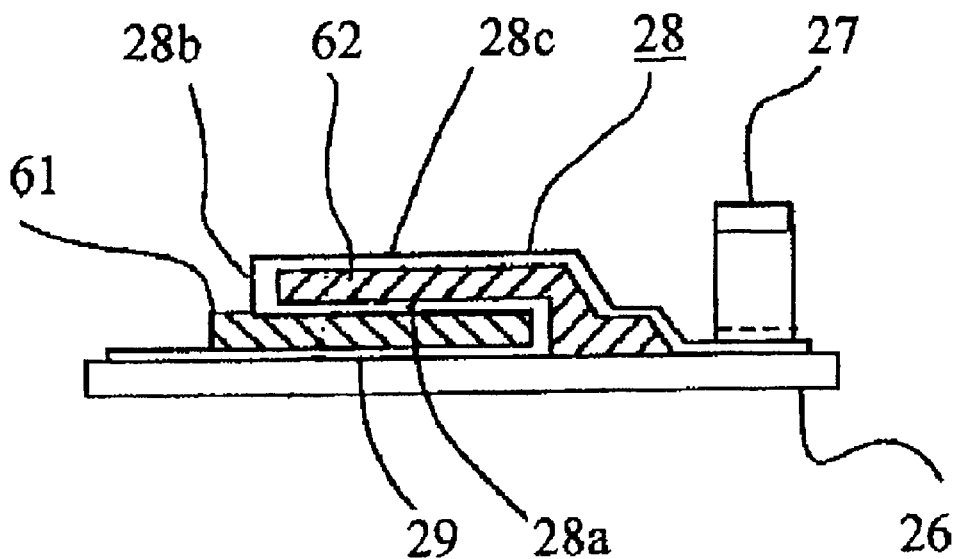
FIG. 6 is a cross-sectional view taken along the line VI—VI of FIG. 5.

In FIG. 5 is shown a plan view of the module according to a third embodiment of the present invention. In FIG. 6 is a cross-sectional view of the module taken along the line VI—VI of FIG. 5. In accordance with this embodiment, the current sensor 28, which includes parallel flat plates so as to have a substantially U-character shape in section by the use of a thin film formation process, is provided on the emitter trunk substrate 26. Specifically, reference numeral 61 designates a first insulating film provided on an electrode pattern 29 on the emitter trunk substrate 26. The first flat plate 28a of the current sensor 28 is made from a metallic film on the first insulating film. The first flat plate 28a has one end connected to the electrode pattern 29. Reference numeral 62 designates a second insulating film, which is provided on the first flat plate 28a. The second flat plate 28c of the current sensor is formed from a metallic film on the second insulating film. The first and second flat plates 28a, 28c are provided so as to be opposed each other, and both flat plates are connected by the bent portion 28b. The detection terminals 34, 35 are provided on lateral portions of the first and second flat plates 28a, 28c, which are opposed each other. The module emitter electrode 27 is provided on the emitter trunk substrate 26, and the module emitter electrode is connected to the second flat plate 28c. The emitter trunk substrate 26, the electrode pattern 29, the first insulating film 61, the first flat plate 28a, the second insulating film 62 and the second flat plate 28c are sequentially layered in close contact fashion. In this embodiment, the metallic film may be made of aluminum, and the first and second insulating films may be a silicon oxide film. Explanation of other elements will be omitted since these elements are similar to those of the first embodiment.

Figure 8:
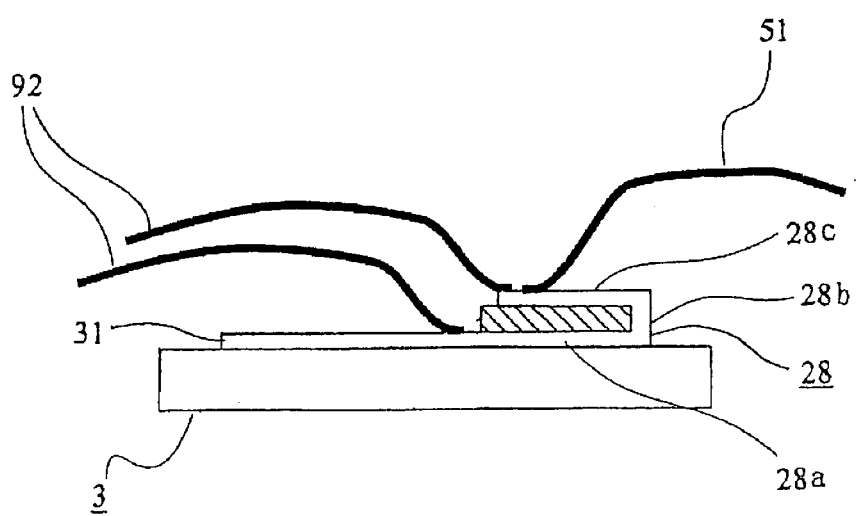
FIG. 8 is a cross-sectional view taken along the line VIII—VIII of FIG. 7.
Figure 9:
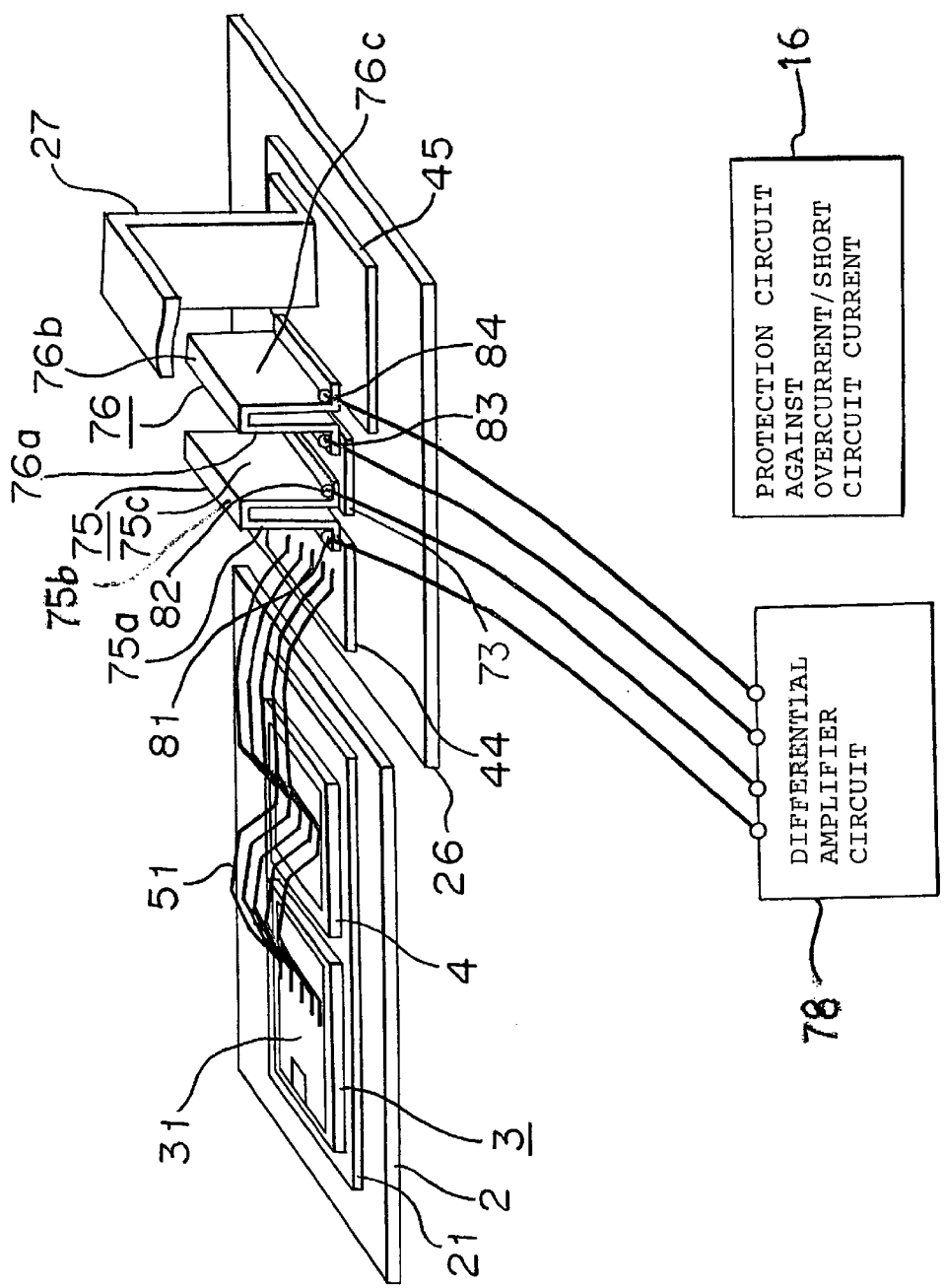
FIG. 9 is a perspective view of the power semiconductor module according to a fifth embodiment of the present invention.
Figure 10:
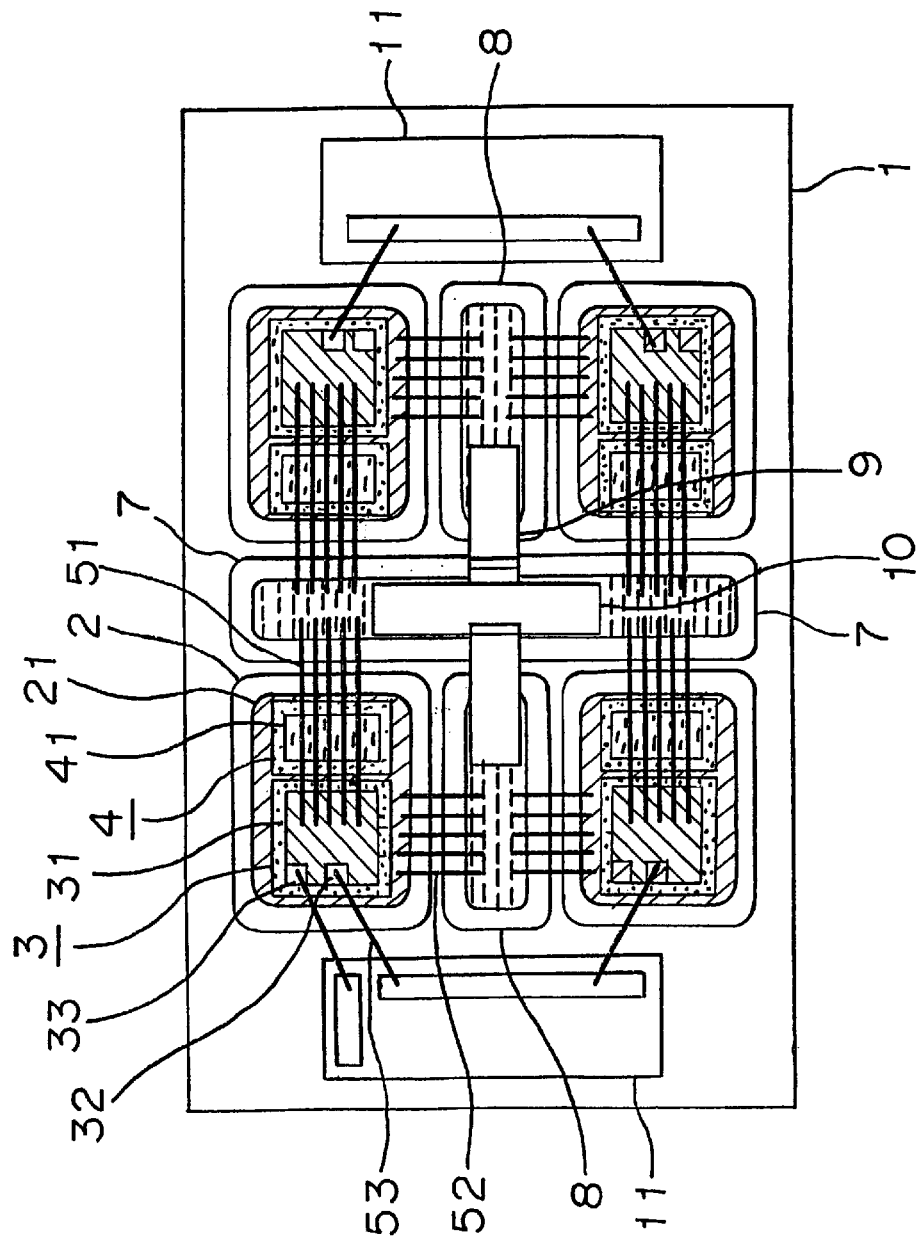
FIG. 10 is a plan view of a conventional power semiconductor module.
Figure 11:
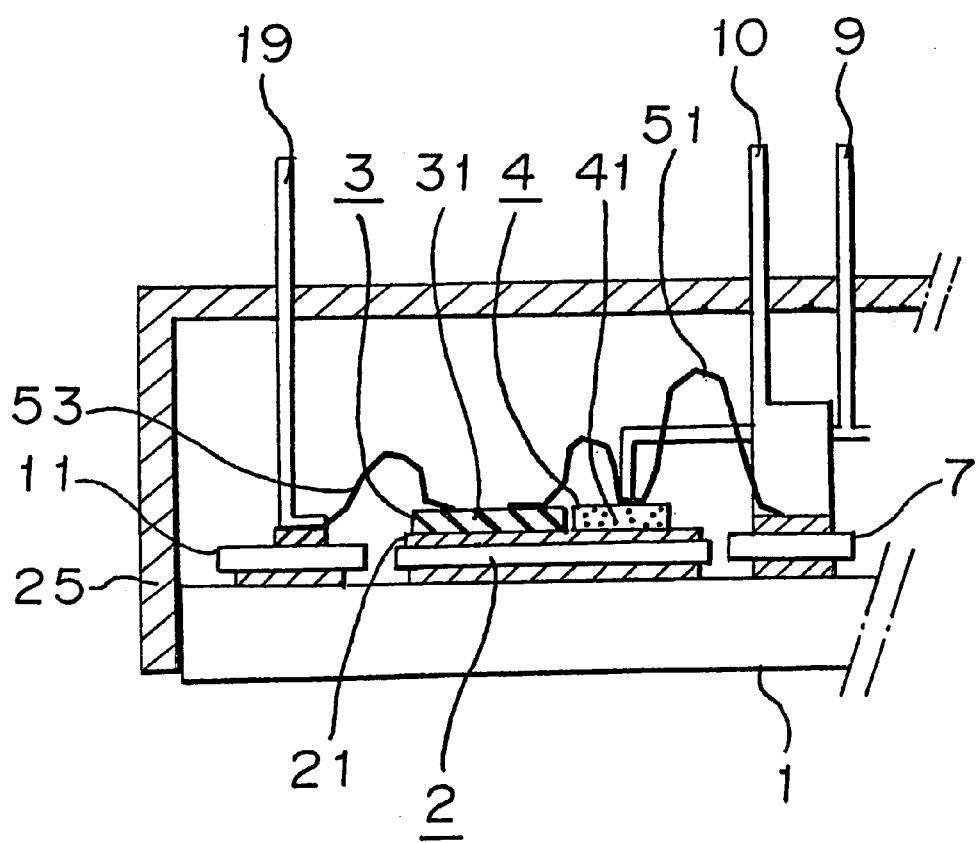
FIG. 11 is a partial cross-sectional view of the conventional power semiconductor module.
Figure 12:
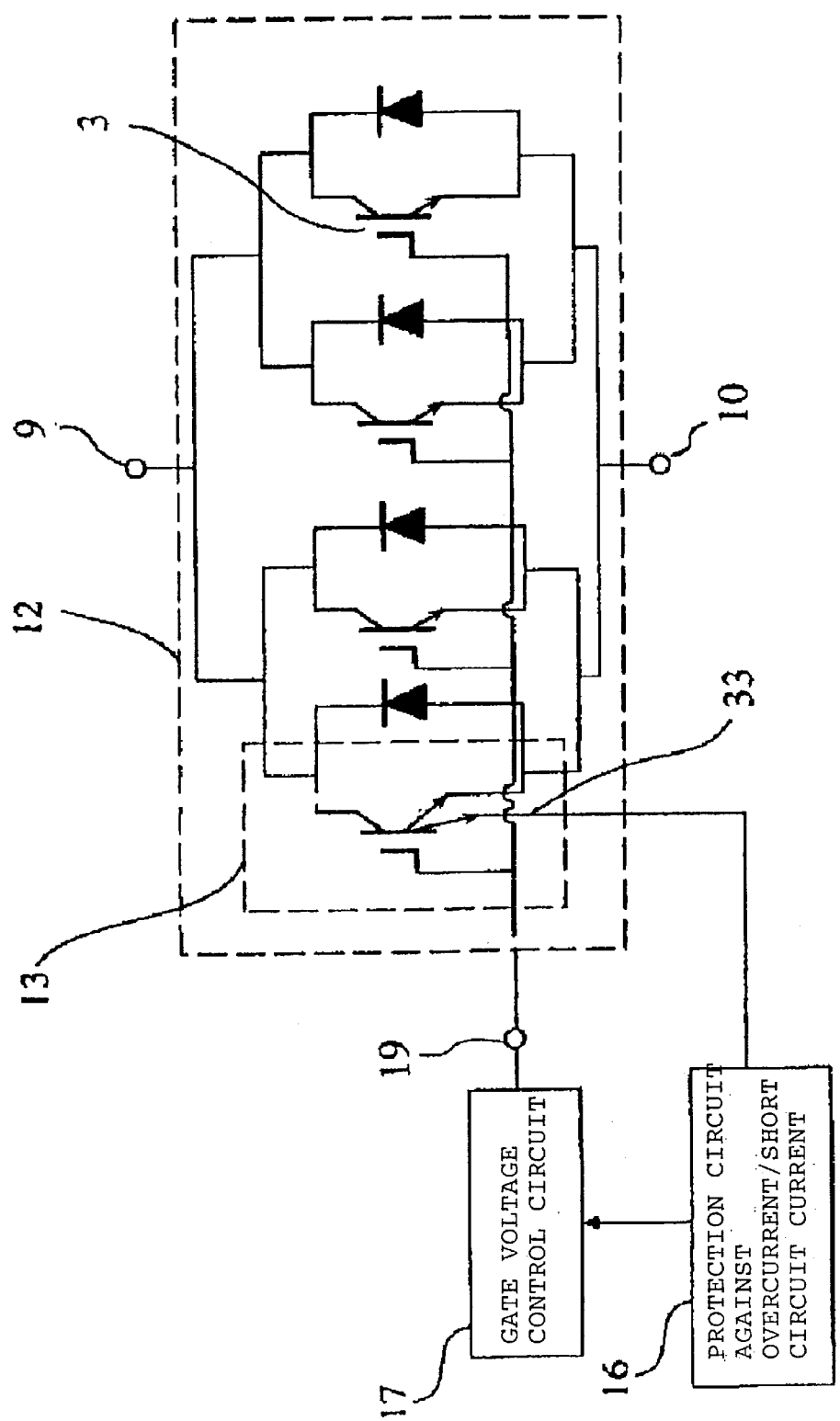
FIG. 12 is a block diagram showing the protection circuit of the conventional power semiconductor module.

In accordance with this embodiment, the current sensor 28 with the parallel flat plates opposed each other is provided on the emitter trunk substrate 26 in close contact fashion. In general, the emitter trunk substrate 26 has a rear side thereof provided with the heat dissipating plate 1 as shown in FIGS. 8 and 9 to increase cooling efficiency. In this case, the current sensor 28 can prevent from being broken due to self-heating, allowing measurement to be carried out even in a current region with a great primary current flowed therethrough.

Inductance of the structure with the flat plates opposed each other is proportional to the distance between the opposed sides as stated earlier. In other words, the inductance of the current sensor 28 is made smaller as the thickness of the second insulating film 62, which determines the distance between the first and second flat plates 28a, 28c, becomes thinner.

The structure on the emitter trunk substrate 26 in parallel and closed contact fashion in accordance with this embodiment can use a thin film formation technique, such as vapor deposition, to form the insulating films and the metallic films, making the distance between the first and second flat plates 28a, 28b extremely smaller. By the use of a current thin film formation technique, such as vapor deposition, the insulating films and the metallic films can be formed so as to be as extremely thin as $\mu$m. Accordingly, the current sensor can have the inductance reduced to be applicable even to higher frequencies.

EMBODIMENT 4

Figure 7:
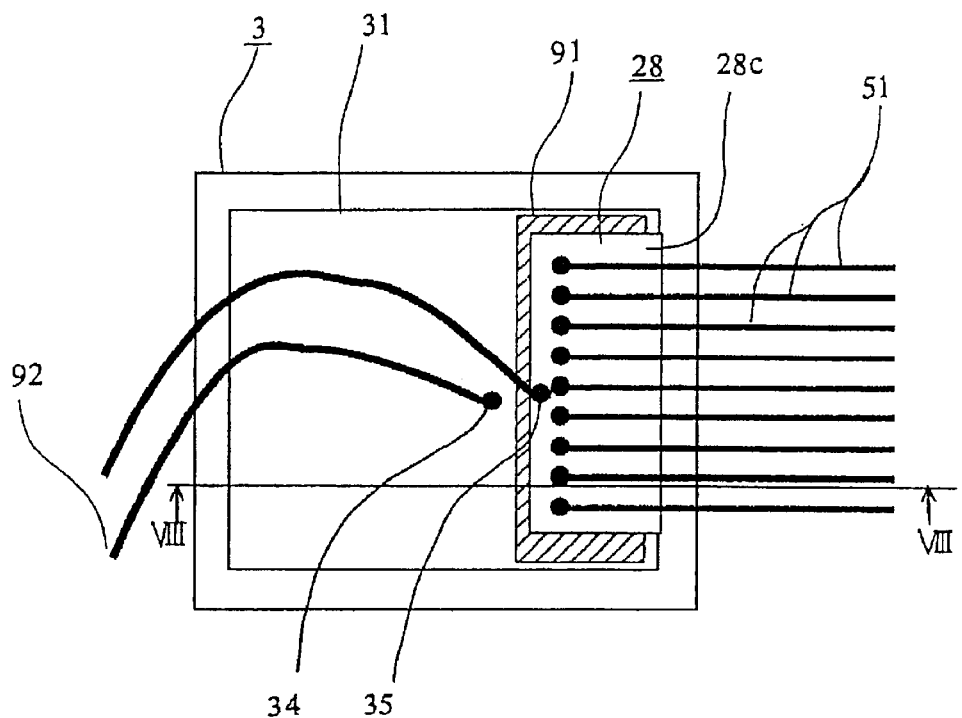
FIG. 7 is a plan view of an IGBT device of the power semiconductor module according to a fourth embodiment of the present invention.

In FIG. 7 is shown a plan view of an IGBT device of the module according to a fourth embodiment of the present invention. In FIG. 8 is shown a cross-sectional view taken along the line VIII—VIII of FIG. 7. In this embodiment, the current sensor 28 is provided on a surface of the IGBT device so as to include parallel flat plates in a substantially U-character shape in section by the use of a thin film formation process as in the third embodiment.

In FIGS. 7 and 8, reference numeral 91 designates an insulating film, which is provided between the first and second flat plates 28a, 28c of the current sensor 28. The first flat plate 28a is provided on the IGBT device 3 in close contact, the insulating film 91 and the second flat plate 28c are sequentially put on the first flat plate in close contact, and the first and second flat plates 28a, 28c are formed so as to be opposed each other. The first and second flat plates 28a, 28c are connected each other through the bent portion 28b, and the first flat plate 28a is connected to the emitter electrode 31 of the IGBT device 3 as a one-piece construction.

Reference numeral 92 designates aluminum wires for connection from the detection terminals 34, 35 to a protection circuit against overcurrent/short circuit current, not shown. Explanation of the other elements will be omitted since the other elements are similar to those in the third embodiment.

In accordance with this embodiment, the first and second flat plates 28a, 28c of the current sensor 28 can be provided so as to sandwich the insulating film 91 in close contact as in the third embodiment, reducing the inductance of the current sensor 28, and consequently allowing the current sensor to be applicable even to higher frequencies, as explained with respect to the third embodiments.

In this embodiment, the current sensor 28 is provided on the IGBT device 3. This arrangement can eliminate an additional space for the current sensor 28 in the module, offering an advantage in that the module can be made smaller.

Although the current sensor 28 is provided on the IGBT device 3 in this embodiment, the current sensor may be provided on a diode device (indicated by 4 in FIG. 1) in the module to offer a similar advantage. In case of a MOSFET module, the current sensor may be provided on the MOSFET module so as to connect with a source electrode, offering a similar advantage.

EMBODIMENT 5

In FIG. 9 is shown a perspective view of the module according to a fifth embodiment of the present invention. In this embodiment, two current sensors are provided in the primary current path, and the primary current is detected from a difference between detected outputs from both current sensor.

In this Figure, reference numeral 73 designates a third electrode pattern, which is provided on the emitter trunk substrate 26, and which is spaced from the first and second electrode patterns 44, 45 with small gaps. Reference numeral 75 designates a first current sensor, which is formed from parallel flat plates so as to have a substantially U-character shape in section, and which comprises first and second flat plates 75a, 75c and a bent portion 75b connecting the first and second flat plates 75a, 75c. Reference numeral 76 designates a second current sensor similar to the first current sensor, which comprises first and second flat plates 76a, 76c and a bent portion 76b connecting the first and second flat plates 76a, 76c. The first current sensor 75 has one end of the first flat portion 75a and one end of the second flat portion 75c soldered to the first electrode pattern 44 and the third electrode pattern 73, respectively. The second current sensor 76 has one end of the first flat plate 76a and one end of the second flat plate 76c soldered to the third electrode pattern 73 and the second electrode pattern 45.

The first and second current sensors 75, 76 are formed so as to be identical to each other in inductance and different from each other in resistance. Specifically, both current sensors 75, 76 are formed in the same shape and are made of different materials. For example, the first current sensor 75 is made of copper while the second current sensor 76 is made of aluminum.

A potential difference V1 is outputted from detection terminals 81, 82 at both ends of the first current sensor 75, and a potential difference V2 is outputted from detection terminals 83, 84 at both ends of the second current sensor 76.

Reference numeral 78 designates a differential amplifier circuit, into which the potential differences V1, V2 are inputted from the detection terminals 81–84 of the first and second sensors 75, 76, and which outputs a difference between the inputted potential differences into the protection circuit 16 against an overcurrent/short circuit current. Explanation of other elements is omitted since these elements are similar to those of the second embodiment.

The primary current flowing through the IGBT device 3 passes through the path extending from the aluminum wires 51 to the module emitter electrode 27 via the first and second current sensors 75, 76. The potential difference V1 outputted from the first current sensor 75 and the potential difference V2 outputted from the second current sensor 76 are inputted into the differential amplifier circuit 78, and the difference between both potential differences is inputted into the protection circuit 16 against an overcurrent/short circuit current.

Provided that the inductance and the resistance of the first current sensor 75 are L1 and R1, respectively, and that the inductance and the resistance of the second current sensor 76 are L2 and R2, respectively, the output voltages V1, V2, which are generated at the first and second current sensors 75, 76 when the primary current i flows through both current sensor, are expressed, respectively, as follows:

$V1=R1 \cdot i+L1 \cdot di/dt$ $V2=R2 \cdot i+L2 \cdot di/dt$

The difference ΔV between both output voltages is expressed as follows:

$\Delta V=V1-V2=(R1-R2)i+(L1-L2)di/dt$

The first and second current sensors 75, 76 have the same value of inductance since both current sensors 75, 76 are formed in the same shape. Accordingly, ΔV=(R1−R2)i is obtained. This means that the difference between the output voltages V1, V2 is independent from the inductance in each of the current sensors 75, 76 and is determined only by the difference between the resistances. Thus, it is possible to correctly measure the primary current even in higher frequencies since the output voltage after differential amplification does not depend on frequencies.

In the first embodiment through the fifth embodiment, the appropriate material for the current sensing unit 3 is a material that is less dependent on temperatures in terms of resistance in the temperature range from −40° C. to 125° C. as the operational temperature for the power semiconductor module, in consideration with a change in resistance caused by a temperature change. For example, an alloy of copper and nickel, an alloy of copper, manganese and nickel, and an alloy of copper, nickel and zinc are appropriate.

Obviously, numerous modifications and variations of the present invention are possible in light of the above teachings. It is therefore to be understood that within the scope of the appended claims, the invention may be practiced otherwise than as specifically described herein.

The entire disclosure of Japanese Patent Application JP11-097246 filed on Apr. 5, 1999 including specification, claims, drawings and summary are incorporated herein by reference in its entirety.

What is claimed is:

1. A power semiconductor module comprising:

an insulating substrate;

a plurality of semiconductor devices on the insulating substrate;

a plurality of module electrodes on the insulating substrate and connected to the semiconductor devices; and a current sensing unit comprising a current sensor including a conductor in a primary current path wherein the conductor includes parallel flat plates having a substantially U-shape in cross-section and a primary current is detected from a potential difference between inner portions of the conductor.

2. The power semiconductor module according to claim 1, wherein the current sensor is integrally with a module electrode.

3. The power semiconductor module according to claim 1, wherein the current sensor is located on a second insulating substrate.

4. The power semiconductor module according to claim 3, wherein the current sensor has an insulating film between the parallel flat plates, and one of the parallel flat plates is located on the second insulating substrate.

5. The power semiconductor module according to claim 1, wherein the current sensor has an insulating film between and in contact with the parallel flat plates, and one of the parallel flat plates is located on a semiconductor device.

6. The power semiconductor module according to claim 1, wherein the current sensing unit includes two current sensors having equal inductance and the primary current is detected from a difference between potential differences at inner portions of the respective current sensors.

* * * * *